United States Patent [19]

Kasahara

[11] Patent Number: 4,932,064
[45] Date of Patent: Jun. 5, 1990

[54] SEMICONDUCTOR DEVICE

[75] Inventor: Takeshi Kasahara, Tsurugashima, Japan

[73] Assignee: Toko Kabushiki Kaisha, Tokyo, Japan

[21] Appl. No.: 108,625

[22] Filed: Oct. 15, 1987

[30] Foreign Application Priority Data

Oct. 21, 1986 [JP]  Japan ................................ 61-250429

[51] Int. Cl.$^5$ .............................................. G06K 9/00
[52] U.S. Cl. ......................................... 382/8; 382/48;
382/61; 357/55; 357/56
[58] Field of Search ................ 382/8, 48, 61; 357/55, 357/56

[56] References Cited

U.S. PATENT DOCUMENTS 4,233,625 11/1980 Altman ................................... 382/8
4,325,077 4/1982 Dunham ................................ 382/8

Primary Examiner—Leo H. Boudreau
Assistant Examiner—Michael Razavi
Attorney, Agent, or Firm—Stevens, Davis, Miller & Mosher

[57] ABSTRACT

A semiconductor device characterized in that at least two elements having approximately the same area are formed on the same chip, the two elements are so disposed as to be sectionalized by a street, having an angle with respect to any scribe lines along which the semiconductor device is to be cut, and the semiconductor device is composed of a pattern adapted for easy pattern recognition by detecting the street.

3 Claims, 2 Drawing Sheets

SEMICONDUCTOR DEVICE

BACKGROUND OF THE INVENTION

1. Field of the Invention

The present invention relates generally to the semiconductor art and more particularly to a semiconductor device capable of easy wafer positioning by recognizing a pattern fabricated or formed on a wafer using a photo-etching process, for instance.

2. Prior Art

FIG. 1 shows an outline of a semiconductor device wherein elements 20a and 20b having approximately the same area are fabricated on the same chip 20 to be cut out of a wafer 10.

Referring to FIG. 1, 30 denotes a region by which two or more elements formed on one chip are sectionalized. This region will be referred to as "a street". Dot-dash lines $X_1$, $X_2$ and $Y_1$, $Y_2$ denote scribe lines along which a wafer and a chip 20 on which are fabricated elements 20a and 20b having approximately the same area are cut out. 5 denotes a monitor pattern formed at a corner of each chip for pattern recognition.

Although a region along which a wafer is cut out is usually called "a street", it will be understood that the term will be limited to the previously mentioned particular case according to this invention.

Now, pattern recognition consists of irradiation, for example, by a scanning laser beam, upon a wafer on which a pattern is fabricated and sensing the pattern by means of an image sensor such as a CCD (charge coupled device) for recognition of the entire pattern of an element or X- and Y-axis scribe lines for wafer positioning control. This is followed by processes such as alignment, scribing, etc.

Pattern recognition takes place, as shown at 4 in FIG. 1, by irradiating a scanning laser beam upon the region 4 bounded by dotted lines on the wafer 10.

In pattern recognition, for instance, the region 4 bounded by dotted lines on the wafer is irradiated with a scanning laser beam and the individual element patterns are discriminated from each other by only sensing X- and Y-axis scribe lines, without sensing the overall patterns, in order to shorten the processing time.

Scattered reflections take place from the regions of scribe lines $Y_1$ and $Y_2$ and the street 30 within the chip as shown in FIG. 2, when the wafer is irradiated with a laser beam.

Since the intensity of light reflected from these regions is attenuated, an output waveform as shown in FIG. 2 is obtained. However, there may arise a possibility of erroneous recognition of the individual patterns, because the scribe lines and the street have approximately the same reflection factor.

This will result in an alignment process under conditions of erroneous pattern recognition or in cutting out chips along $X_1$ and $X_2$ scribe lines (dot-dash line) and streets Ya and Yb (shown dotted) and at times, chips may be cut out so as to break up some elements into fragments.

There has been a problem of the occurrence of defects in the alignment process caused by erratic pattern recognition in cases where the pattern is relatively simple, i.e., that of a variable-capacitance diode.

A process of irradiation of a laser beam upon the entire patterns to recognize monitor patterns in the individual patterns to solve such a problem used to become a cause for inability of a high-speed wafer processing, that is, productivity used to be greatly sacrificed.

In other words, such a process could not be recommended and there remained room for improvements.

SUMMARY OF THE INVENTION

A principal object of this invention is to provide a semiconductor device having a pattern configuration capable of pattern positioning by recognizing only a part of the pattern.

A semiconductor device according to this invention has been contrived to fulfill the above-mentioned object.

The invention relates to semiconductor devices such that at least two elements having approximately the same area are formed within the same chip. These two or more elements formed on the same chip are so disposed as to be divided into so many sections by a pattern having a street (or streets) which is unparallel to any scribe line along which a wafer is cut out.

This results in ease with which individual patterns fabricated on a wafer can be recognized.

DESCRIPTION OF THE PREFERRED EMBODIMENTS

Now, some preferred embodiments of semiconductor devices according to this invention will be described by reference to FIGS. 3 through 7.

A variable-capacitance diode, for instance, employs a semiconductor device containing two or more elements arranged on one chip.

A description will now be made of a semiconductor device notably effective for such a pattern.

Figure 1:
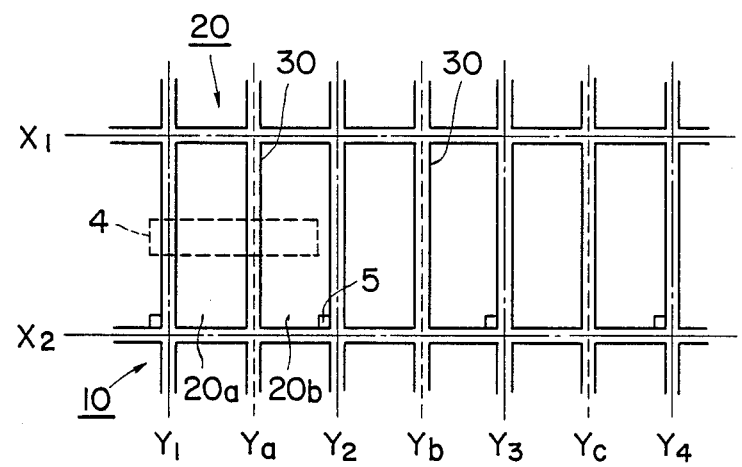
FIG. 1 shows an example of a pattern for a conventional semiconductor device.
Figure 2:
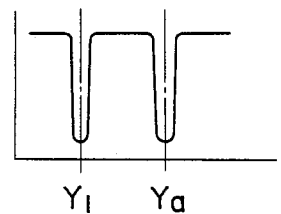
FIG. 2 is an output waveform diagram when the semiconductor device of FIG. 1 is irradiated with a laser beam and its reflected light is detected.
Figure 3:
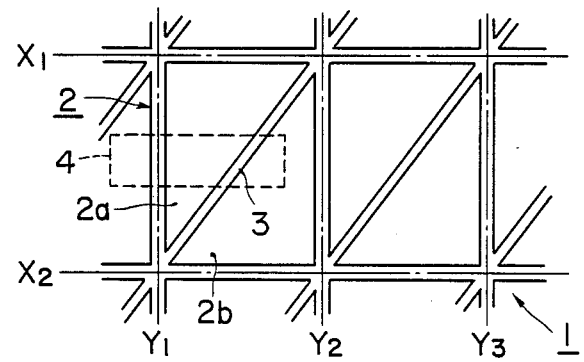
FIG. 3 is a sketch of a pattern for an embodiment of a semiconductor device according to this invention.

FIG. 3 illustrates a part of an embodiment in which semiconductor devices, each containing two elements on the same chip, are arranged in succession on a wafer.

Referring to FIG. 3, 1 denotes a part of a wafer which has been subjected to a process such as diffusion, 2 denotes a chip on which elements 2a and 2b having approximately the same area are formed; 3 denotes a street by which elements formed on the same chip 2 are divided into two sections.

$X_1, X_2, \ldots$ and $Y_1, Y_2, \ldots$ shown by the dot-dash lines are scribe lines.

The street 3 in FIG. 3 diagonally divides the chip 2 into two sections. The elements 2a and 2b divided by the street 3 have approximately the same area.

When the region 4 bounded by dotted lines on the wafer 1 is irradiated with a scanning laser beam, the scribe lines, or X- and Y-axis are detected and wafer position is determined, followed by an alignment process.

Figure 4:
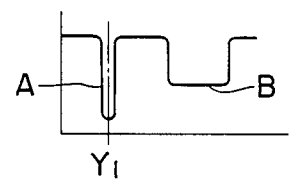
FIG. 4 is an output waveform diagram obtained when the semiconductor device of FIG. 3 is irradiated with a laser beam and its reflected light is detected.

FIG. 4 is an output waveform diagram obtained when the wafer of FIG. 3 is irradiated with a laser beam and a reflected light from the wafer is detected. The ordinate and the abscissa denote respectively the intensity of a reflected light and the time axis.

A in FIG. 4 denotes an output corresponding to scattered reflections of a laser beam from scribe line $Y_1$, and B denotes those from street 3. Pattern recognition is carried out from the waveform shown in FIG. 4.

A great deal of scattered reflections corresponding to the width of the scribe line $Y_1$ will occur with a resultant great attenuation of the reflected light, when a laser beam of a constant width scans the region 4 at a constant speed and the position of the scribe line $Y_1$.

In contrast, when a laser beam scans the position of the diagonal street 3, the time interval during which the street 3 is scanned will become longer than that during which the position of scribe line $Y_1$ is scanned. In addition, an attenuation of the reflected light in the latter case will be lesser than that in the former case. By detecting a reflected light from such a wafer, the scribe lines $Y_1$, $Y_2$, . . . and the street 3 can easily be discriminated from each other.

When the region 4 on the wafer is irradiated with a laser beam, the position of Y-axis on the wafer 2 is detected. The wafer position is detected by applying a similar method for the X-axis.

Pattern recognition thus takes place without scanning a laser beam over the entire pattern surface of a chip on the wafer 2. Therefore, high-speed positioning can be effected. Needless to say, positioning may be effected by detecting the street 3.

Figure 5:
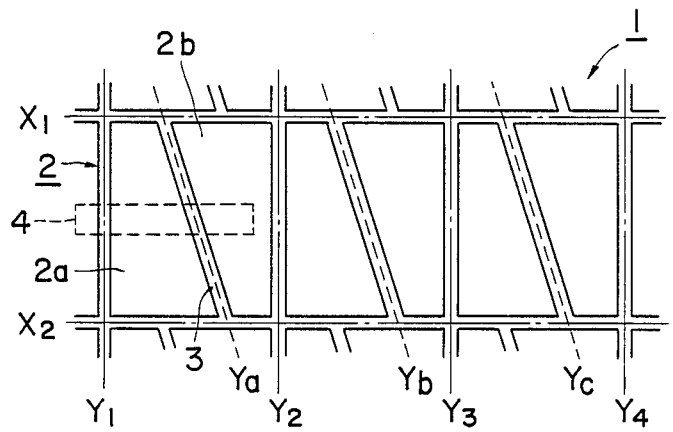
FIG. 5 is a sketch of a pattern for another embodiment of a semiconductor device according to this invention.

FIG. 5 also illustrates a case where elements 2a and 2b having the same area are sectionalized by the street 3 having an angle with respect to a scribe line. As compared with a case of diagonally sectionalizing the elements 2a and 2b as shown in FIG. 3, the street 3 in FIG. 5 forms lesser acute angles than in FIG. 3 with respect to the X- and Y-axis. This is effective in improvement of withstand voltage characteristics of the elements.

Figure 6:
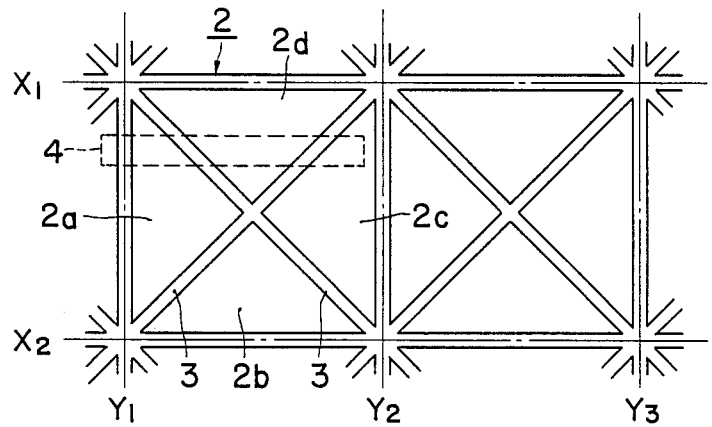
FIG. 6 is a sketch of a pattern for still another embodiment of a semiconductor device according to this invention.

FIG. 6 shows an embodiment of a chip 2 wherein four elements 2a, 2b, 2c, and 2d having approximately the same area are formed. As illustrated, two streets 3 are diagonally arranged to intersect at the center of the chip 2, dividing the chip surface into four equal parts. If the same diffusion process is applied, the electrical characteristics of all four elements will be the same.

Even with this embodiment, the scribe line X- and Y-axis and the streets 3 can be easily discriminated from each other by irradiating the region 4 with a laser beam and measuring the reflected light.

This embodiment is advantageous in that the four elements having the same area can be formed with ease and that recognition of the individual patterns is quite easy.

Figure 7:
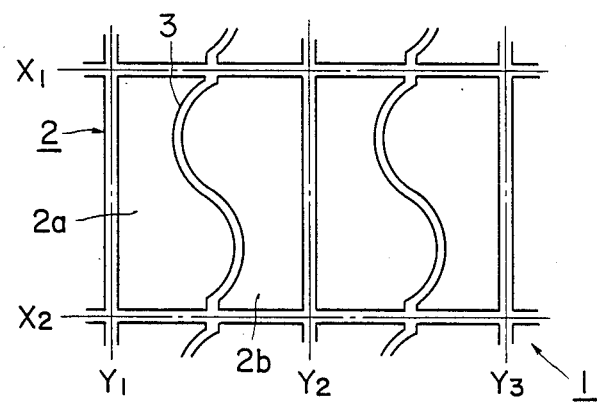
FIG. 7 is a sketch of a pattern for a further embodiment of a semiconductor device according to this invention.

FIG. 7 is an embodiment of this invention wherein chip 2 is divided into two elements by an S-shaped street 3. Any suitable wave-type street may be used instead of the S-shaped street.

Even with such a pattern configuration, the scribe lines and the street 3 can be easily discriminated from each other and pattern recognition becomes easy by detecting a reflected light of a laser beam from a part of the pattern, because a reflected light from the scribe lines $Y_1$, $Y_2$, . . . differs in the attenuation amount from that from the street 3.

Furthermore, with the embodiments illustrated in FIGS. 5 and 7, the acute angle parts can be made much less in number than those in the embodiments of FIGS. 3 and 6. Therefore, the electrical characteristics of each element can be considerably improved.

A semiconductor device according to this invention is represented by a variable-capacitance diode, for instance, formed by a comparatively simple pattern.

However, a similar concept will be obviously applicable to the integrated circuitry, provided there exists a boundary region which divides the area of a chip into sections in the initial diffusion process or as mentioned previously.

A semiconductor device according to this invention is one in which two or more elements are formed on the same chip and one provided with a pattern effective in wafer positioning in alignment.

With a semiconductor device having such a pattern, alignment positioning is greatly facilitated by sensing only a part of the entire pattern, without the need for sensing the entire pattern.

Furthermore, there is an advantage such that elements having the same area can be easily formed on the same chip.

According to a pattern of a semiconductor device of this invention, pattern recognition becomes feasible by irradiating a laser beam upon an extremely narrow range.

Such a pattern recognition system can claim to be suitable for high speed, and effective wafer processing as compared with pattern recognition by scanning a laser beam over the entire pattern surface, because only a part of the wafer needs to be irradiated.

What is claimed is:

1. A semiconductor device comprising:
    a wafer having a plurality of chips, scribe lines and element-separating streets therein and forming a pattern on said wafer;
    at least one of said chips having at least two elements of approximately the same area formed therein;
    said at least two elements being arranged on said at least one chip with a separating street between them, said separating street being used for separating said elements and having at least a portion thereof inclined at an angle with respect to scribe lines along which said semiconductor device is to be cut; and
    said wafer pattern being recognizable by pattern recognition equipment.

2. A semiconductor device according to claim 1 wherein said at least two elements are separated by a diagonal street.

3. A semiconductor device according to claim 1 wherein at least two elements are separated by a curved street.

* * * * *